United States Patent
Luo et al.

(10) Patent No.: US 10,083,728 B2
(45) Date of Patent: Sep. 25, 2018

(54) MEMORY CONTROLLER, MEMORY MODULE AND MEMORY SYSTEM

(71) Applicant: MEDIATEK INC., Hsin-Chu (TW)

(72) Inventors: Yan-Bin Luo, Taipei (TW); Sheng-Ming Chang, New Taipei (TW); Bo-Wei Hsieh, Tainan (TW); Ming-Shi Liou, Taipei (TW); Chih-Chien Hung, Hualien County (TW); Shang-Pin Chen, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 358 days.

(21) Appl. No.: 14/324,228

(22) Filed: Jul. 6, 2014

(65) Prior Publication Data
US 2015/0074346 A1 Mar. 12, 2015

Related U.S. Application Data

(60) Provisional application No. 61/874,773, filed on Sep. 6, 2013.

(51) Int. Cl.
*G06F 12/00* (2006.01)
*G11C 8/12* (2006.01)
*G06F 13/16* (2006.01)

(52) U.S. Cl.
CPC .............. *G11C 8/12* (2013.01); *G06F 12/00* (2013.01); *G06F 13/1668* (2013.01)

(58) Field of Classification Search
CPC ....................................................... G06F 12/00
USPC ....................................................... 711/105
See application file for complete search history.

(56) References Cited

U.S. PATENT DOCUMENTS

| | | | | |
|---|---|---|---|---|
| 5,953,280 | A * | 9/1999 | Matsui | G11C 7/1072 365/185.11 |
| 7,068,064 | B1 * | 6/2006 | Yen | G06F 13/4086 326/28 |
| 2005/0071600 | A1 * | 3/2005 | Bungo | G06F 12/0669 711/170 |
| 2006/0091900 | A1 | 5/2006 | Kang et al. | |
| 2008/0112233 | A1 | 5/2008 | Woo et al. | |
| 2010/0109704 | A1 * | 5/2010 | Carr | G11C 5/063 326/62 |
| 2010/0138598 | A1 | 6/2010 | LaBerge | |

(Continued)

FOREIGN PATENT DOCUMENTS

| CN | 1565034 A | 1/2005 |
|---|---|---|
| CN | 1770061 A | 5/2006 |
| CN | 102203866 A | 9/2011 |

*Primary Examiner* — Gautam Sain
(74) *Attorney, Agent, or Firm* — Wolf, Greenfield & Sacks, P.C.

(57) ABSTRACT

A memory module, comprising: a first pin, arranged to receive a first signal; a second pin, arranged to receive a second signal; a first conducting path, having a first end coupled to the first pin; at least one memory chip, coupled to the first conducting path for receiving the first signal; a predetermined resistor, having a first terminal coupled to a second end of the first conducting path; and a second conducting path, having a first end coupled to second pin for conducting the second to a second terminal of the predetermined resistor; wherein the first signal and the second are synchronous and configured to be a differential signal, for enabling a selected memory chip from the at least one memory chip to be accessed.

19 Claims, 4 Drawing Sheets

(56) References Cited

U.S. PATENT DOCUMENTS

| | | | |
|---|---|---|---|
| 2010/0162037 A1* | 6/2010 | Maule | G06F 11/106 714/5.11 |
| 2011/0133773 A1* | 6/2011 | Shau | H03K 19/0005 326/30 |
| 2014/0325105 A1* | 10/2014 | Prete | G06F 13/1642 710/112 |

* cited by examiner

MEMORY CONTROLLER, MEMORY MODULE AND MEMORY SYSTEM

CROSS REFERENCE TO RELATED APPLICATIONS

This application claims the benefit of U.S. Provisional Application No. 61/874,773, which was filed on 2013 Sep. 6 and is included herein by reference.

BACKGROUND

The present invention relates to a memory system, and more particularly to a low-cost and high speed memory controller, a memory module and a memory system.

In memory controlling system, a DDR3 SDRAM (Double-Data-Rate Three Synchronous Dynamic Random Access Memory) interface with single-end signals is very sensitive to external environments, such as chip package type and system board design. In order to guarantee the system performance, IP (Intellectual Property) providers of the memory controller often define the package and PCB (Printed Circuit Board) design constraints to reduce product risks. These design constraints may increase the package size and DDR3 PCB area to cost up the whole system cost. More specifically, for the Chip Select (CSN) signal of the conventional DDR3 SDRAM memory interface, a regulator, i.e. the so called Vtt regulator, is often used to provide a predetermined voltage level at the termination of the conducting path of the CSN signal to reduce the reflection of the CSN signal so that to guarantee the signal integrity in DDR3 applications. However, this Vtt regulator increases the BOM (Bill of Material) cost of the memory controller. Therefore, to introduce a novel memory system to reduce the BOM cost and to relax the external environment requirement of the memory controller is an urgent problem in the field of memory controlling system.

SUMMARY

One of the objectives of the present embodiment is to provide a low-cost and high speed memory controller, a memory module and a memory system.

According to a first embodiment of the present invention, a memory controller is provided. The memory controller comprises: a chip-select transmitter, arranged to generate a first signal for selecting one memory device from a plurality of memory devices and generate a second signal which is an inversed version of the first signal; a first pin, arranged to output the first signal; and a second pin, arranged to output the second signal; wherein the first signal and the second signal are configured to be a differential signal.

According to a second embodiment of the present invention, a memory module is provided. The memory module comprises: a first pin, arranged to receive a first signal; a second pin, arranged to receive a second signal; a first conducting path, having a first end coupled to the first pin; at least one memory chip, coupled to the first conducting path for receiving the first signal; a predetermined resistor, having a first terminal coupled to a second end of the first conducting path; and a second conducting path, having a first end coupled to second pin for conducting the second signal to a second terminal of the predetermined resistor; wherein the first signal and the second signal are synchronous and configured to be a differential signal, for enabling a selected memory chip from the at least one memory chip to be accessed.

According to a third embodiment of the present invention, a memory system is provided. The memory system comprises: a memory controller; and a memory module, comprising at least one memory chip; wherein memory controller generates a differential pair of a first signal and a second signal to the memory module, and the first signal and the second signal are synchronous with each other for enabling a selected memory chip from the at least one memory chip to be accessed by the memory controller.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
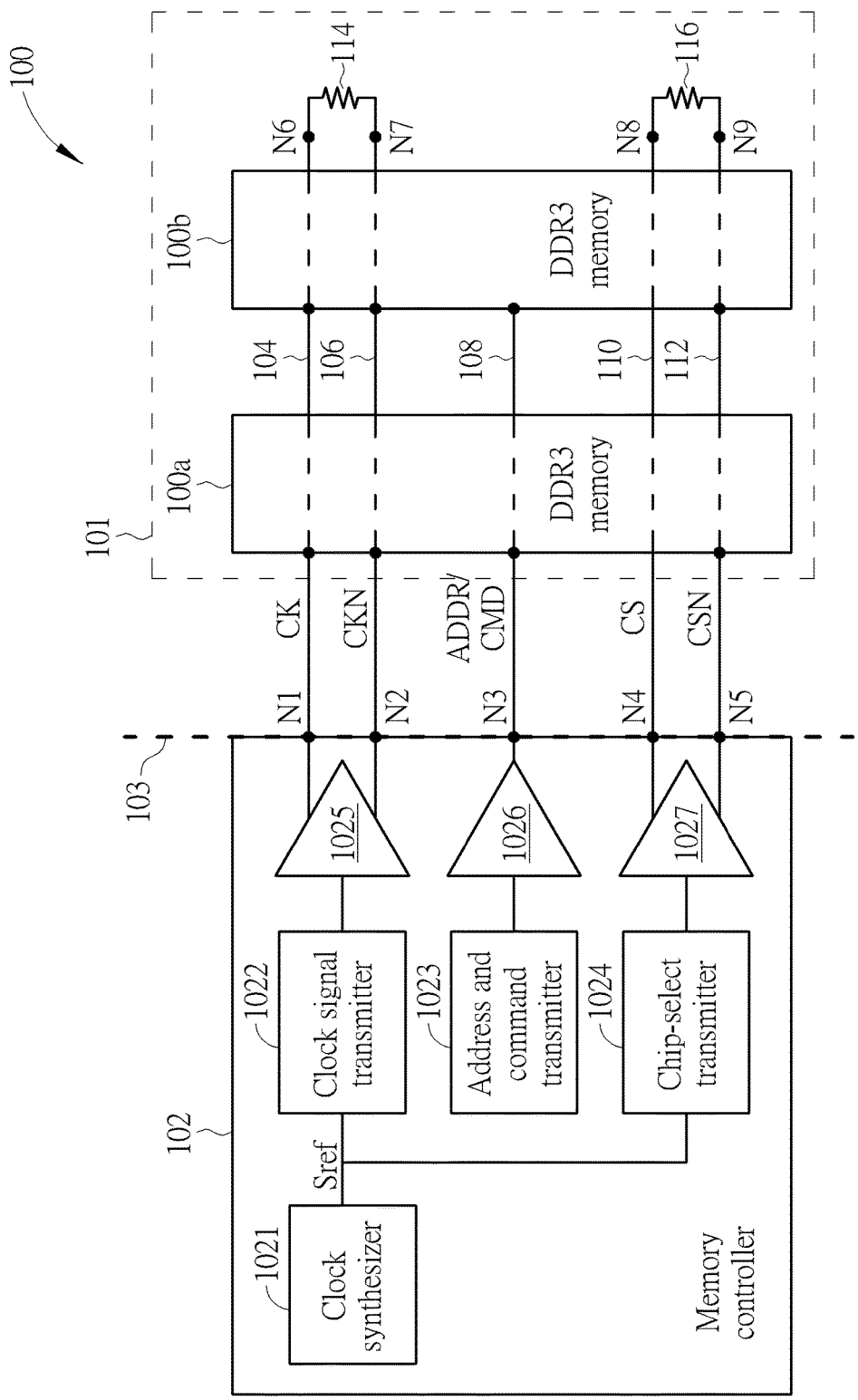
FIG. 1 is a diagram illustrating a memory system according to an embodiment of the present invention.

Please refer to FIG. 1, which is a diagram illustrating a memory system 100 according to an embodiment of the present invention. The memory system 100 may be a DDR3 (Double-Data-Rate Three Synchronous) memory system, where a DDR3 memory controller 102 and a DDR3 memory module 101 are set, including at least one DDR3 memory; however, this is not a limitation of the invention. The DDR3 memory may be a DDR3 SDRAM (Double-Data-Rate Three Synchronous Dynamic Random Access Memory). Two DDR3 memories 100a, 100b are depicted in FIG. 1 for illustrative purpose, but this is not a limitation of the invention. A plurality of conducting paths 104, 106, 108, 110, and 112 are configured for communication, to allow the DDR3 memories 100a, 100b of the DDR3 memory module 101 to be controlled by the DDR3 memory controller 102 through an interface 103. A first predetermined resistor 114 is arranged to connect the conducting path 104 and the conducting path 106, and a second predetermined resistor 116 is arranged to connect the conducting path 110 and the conducting path 112.

The DDR3 memory controller 102 is arranged to generate a plurality of control signals for controlling the two DDR3 memories 100a, 100b. The plurality of control signals may be a differential clock signals CK/CKN, an address signal bus ADDR, a command signal bus CMD, a chip-select signal CS, and an inversed chip-select signal CSN corresponding to the chip-select signal CS. The chip-select signal CS and the inversed chip-select signal CSN are configured to be a differential signal. Therefore, the inversed chip-select signal CSN is the complementary of the chip-select signal CS. For example, the voltage level of inversed chip-select signal CSN may be the inverse voltage level of the chip-select signal CS.

The differential clock signals CK/CKN are provided to the DDR3 memories 100a, 100b as clock sources via the conducting path 104 and the conducting path 106, wherein the conducting path 104 is arranged to conduct the clock signal CK and the conducting path 106 is arranged to conduct the complementary clock signal (i.e. CKN) of the clock signal CK. The address signal bus ADDR and the command signal bus CMD are transmitted to the DDR3 memories 100a, 100b via the conducting path 108. The active low chip-select signal CSN is connected to the DDR3 memories 100a, 100b in series via the conducting path 110, and terminates at the first predetermined resistor 116; the active high chip-select signal CS bypasses the DDR3 memories 100a and 100b, and terminates at the first predetermined resistor 116 via the conducting path 110. Please note that the DDR3 is not limited to above connection pattern. In other embodiment, the DDR3 may be connected to the active high chip-select signal CS and bypass the active low chip-select signal CSN.

It should be noted that the conducting path 108 is just a simplified notation. The conducting path 108 may comprise a plurality of conducting paths used to conduct the address signal bus ADDR and the command signal bus CMD respectively.

In addition, the DDR3 memory controller 102 comprises a clock synthesizer 1021, a clock signal transmitter 1022, an address and command transmitter 1023, a chip-select transmitter 1024, a clock signal buffer 1025, an address and command buffer 1026, and a chip-select buffer 1027. The clock synthesizer 1021 is arranged to generate a reference clock Sref. The clock signal transmitter 1022 is arranged to generate the clock signal CK and the complementary clock signal CKN according to the reference clock Sref. The address and command transmitter 1023 is arranged to generate the address signal bus ADDR and the command signal bus CMD. The chip-select transmitter 1024 is arranged to generate the chip-select signal CS and the inversed chip-select signal CSN according to the reference clock Sref.

The clock signal buffer 1025 is arranged to buffer the clock signal CK and the complementary clock signal CKN, and the clock signal buffer 1025 has a first pin N1 and a second pin N2 to output the clock signal CK and the complementary clock signal CKN respectively. The address and command buffer 1026 is arranged to buffer the address signal bus ADDR and the command signal bus CMD, and the address and command buffer 1026 has a third pin N3 to output the address signal bus ADDR and the command signal bus CMD. The chip-select buffer 1027 is arranged to buffer the chip-select signal CS and the inversed chip-select signal CSN, and the chip-select buffer 1027 has a fourth pin N4 and a fifth pin N5 to output the chip-select signal CS and the inversed chip-select signal CSN respectively. Similarly, the third pin N3 is just a simplified notation. The third pin N3 may comprise a plurality of pins used to output the address signal bus ADDR and the command signal bus CMD respectively. Furthermore, the chip-select buffer 1025, the address/command buffer 1026, the clock signal buffer 1027, and the pins N1-N5 can be regarded as the interface 103 of the DDR3 memory controller 102. In other words, the DDR3 memory controller 102 may be a single chip, and the plurality of conducting paths 104, 106, 108, 110, and 112, the first predetermined resistor 114, and the second predetermined resistor 116 are externally connected to the single chip.

More specifically, the conducting path 104 has a first end coupled to the pin N1 and a second end coupled to a first terminal N6 of the first predetermined resistor 114. The conducting path 106 has a first end coupled to the pin N2 and a second end coupled to a second terminal N7 of the first predetermined resistor 114. Furthermore, both the DDR3 memories 100a and 100b are also connected to the conducting paths 104, 106 in order to receive the differential clock signals CK/CKN. The conducting path 108 is coupled to the pin N3 for conducting the address signal bus ADDR and the command signal bus CMD to the DDR3 memories 100a and 100b. The conducting path 110 has a first end coupled to the pin N4 and a second end coupled to a first terminal N8 of the second predetermined resistor 116. The conducting path 112 has a first end coupled to the pin N5 and a second end coupled to a second terminal N9 of the second predetermined resistor 116. According to the present embodiment, the DDR3 memories 100a and 100b are connected to the conducting path 112 in order to receive the chip-select signal CSN. However, the DDR3 memories 100a and 100b are not connected to the conducting path 110. Therefore, the conducting path 110 just by passes the DDR3 memories 100a and 100b. The conducting path 110 is merely arranged to conduct the chip-select signal CS to the first terminal N8 of the second predetermined resistor 116.

Figure 2:
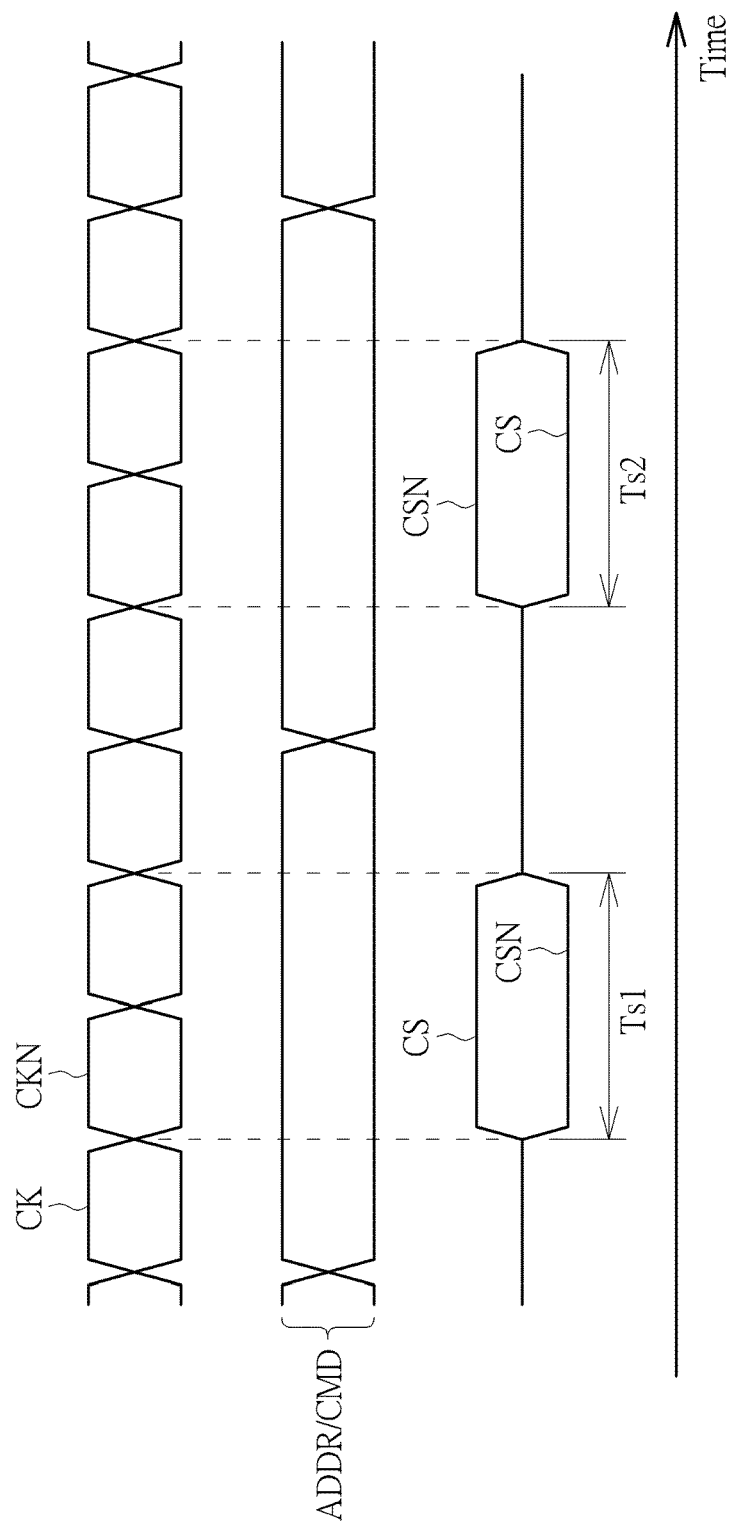
FIG. 2 is a timing diagram illustrating the waveforms of a differential clock signals, an address signal and a command signal, a chip-select signal, and a inversed chip-select signal according to an embodiment of the present invention.

Please refer to FIG. 2, which is a timing diagram illustrating the waveforms of the differential clock signals CK/CKN, the address signal bus ADDR and the command signal bus CMD, the chip-select signal CS, and the chip-select signal CSN according to an embodiment of the present invention. According to this embodiment, when asserted, the chip-select signal CS and the chip-select signal CSN are designated to remain for a length equal to one period of the differential clock signals CK/CKN, and the address signal bus ADDR and the command signal bus CMD are designated to remain for a length equal to two periods of the differential clock signals CK/CKN. In other words, a DDR3 memory (either the DDR3 memory 100a or the DDR3 memory 100b) has time interval as long as one period of the differential clock signals CK/CKN to receive the chip-select signal CSN, and the selected DDR3 memory (either the DDR3 memory 100a or the DDR3 memory 100b) has time interval as long as two periods of the differential clock signals CK/CKN to receive the address signal bus ADDR and the command signal bus CMD. It should be noted that, for the conventional counterpart of the DDR3 memory controller 102, a DDR3 memory is also designed to have time interval as long as one period of the differential clock signals CK/CKN to receive the chip-select signal CSN. However, a loopback design for the chip-select signal CSN is absent thus the conventional system may suffer risk from the reflection problem.

More specifically, according to the present embodiment, when the DDR3 memory controller 102 is going to select the first DDR3 memory 100a, for example, the chip-select transmitter 1024 generates the chip-select signal CS and the chip-select signal CSN substantially at the same time. The voltage level of the chip-select signal CS in a specific time interval Ts1 is the high voltage level, and the voltage level of the chip-select signal CSN in the specific time interval Ts1 is the low voltage level, in which the specific time interval Ts1 substantially equals one period of the differential clock signals CK/CKN as shown in FIG. 2. In other words, when the first DDR3 memory 100a detects the low voltage level of the chip-select signal CSN, the first DDR3 memory 100a is activated to receive the incoming address signal bus ADDR and the command signal bus CMD. Otherwise, the first DDR3 memory 100a just ignores the address signal bus ADDR and the command signal bus CMD.

On the other hand, when the DDR3 memory controller 102 is going to select the second DDR3 memory 100b, the chip-select transmitter 1024 generates the chip-select signal CS having the low voltage level in the specific time interval Ts2 and the chip-select signal CSN having the high voltage level in the specific time interval Ts2. When the second DDR3 memory 100b detects the high voltage level of the chip-select signal CSN, the second DDR3 memory 100b is activated to receive the incoming address signal bus ADDR and the command signal bus CMD. Otherwise, the second DDR3 memory 100b just ignores the address signal bus ADDR and the command signal bus CMD.

Therefore, one DDR3 memory is activated by the high voltage level of the chip-select signal CSN, and the other DDR3 memory is activated by the low voltage level of the chip-select signal CSN. Moreover, the voltage level of the chip-select signal CSN in the specific time interval Ts1 (or Ts2) is designed to be different from the voltage level of the chip-select signal CS in the specific time interval Ts1 (or Ts2).

According to the present embodiment, the length of the conducting path 110 is designed to be equal the length of the conducting path 112. Therefore, the chip-select signal CS and the chip-select signal CSN reach the first terminal N8 and the second terminal N9 of the second predetermined resistor 116 at the same time respectively. In other words, the second predetermined resistor 116 is arranged to receive the chip-select signal CS and the chip-select signal CSN substantially at the same time. In the present embodiment, the impedance of the second predetermined resistor 116 is designed to be the double of the impedance of the conducting path. For example, if the impedance of the conducting path 110 (or 112) is 50 Ohm, then the impedance of the second predetermined resistor 116 is designed to be 100 Ohm. Accordingly, when the high voltage level of the chip-select signal CS and the low voltage level of the chip-select signal CSN reach the first terminal N8 and the second terminal N9 of the second predetermined resistor 116 at the same time respectively, the second predetermined resistor 116 absorbs the chip-select signal CSN and does not generate the reflection of the chip-select signal CSN on the conducting path 112. Accordingly, the power of the reflected signal corresponding to the chip-select signal CSN is substantially reduced by the predetermined resistor 116.

Figure 3:
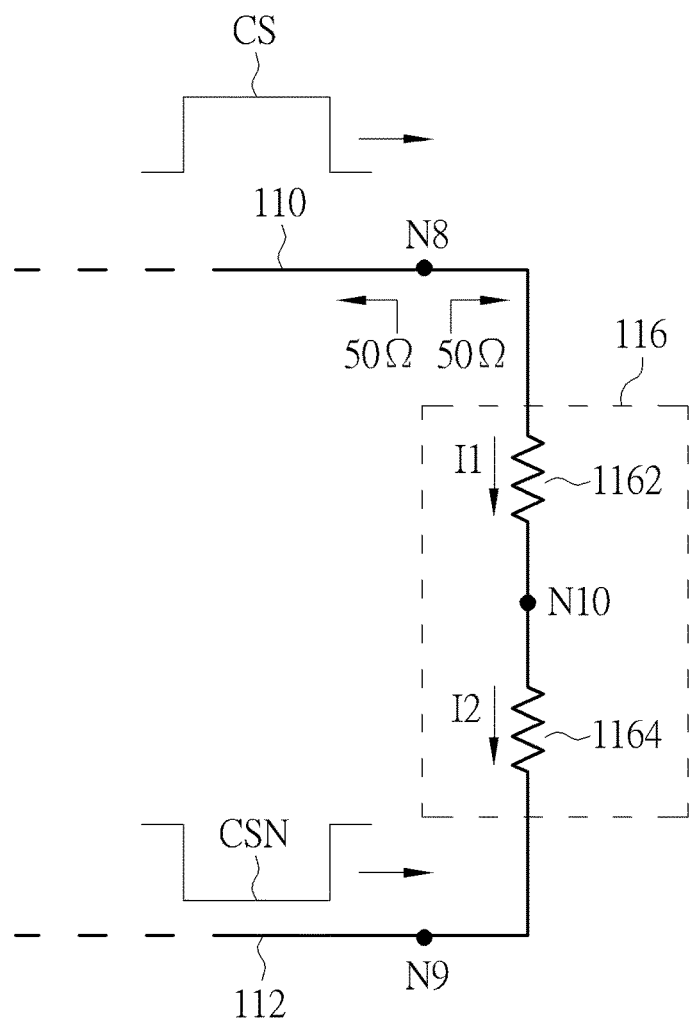
FIG. 3 is a diagram illustrating a second predetermined resistor, a partial of the conducting path, and a partial of the conducting path according to an embodiment of the present invention.

Please refer to FIG. 3, which is a diagram illustrating the second predetermined resistor 116, a partial of the conducting path 110, and a partial of the conducting path 112 according to an embodiment of the present invention. The second predetermined resistor 116 can be regarded as two resistors 1162, 1164 connected in series, wherein each resistor is 50 Ohm. When the high voltage level of the chip-select signal CS and the low voltage level of the inversed chip-select signal CSN reach the first terminal N8 and the second terminal N9 of the second predetermined resistor 116 respectively, a first current I1 is induced to flow to a common terminal N10 from the first terminal N8, and a second current I2 is induced to flow to the second terminal N9 from the common terminal N10. The first current I1 equals the second current I2 because the impedances of the resistors 1162, 1164 are 50 Ohm, and the chip-select signal CS and the inversed chip-select signal CSN are configured to be a differential signal.

Furthermore, the voltage level at the common terminal N10 is the common mode voltage of the high voltage level of the chip-select signal CS and the low voltage level of the inversed chip-select signal CSN. In this embodiment, the common mode voltage may be 0V. Therefore, the impedance (i.e. 50 Ohm) looking into the second end (i.e. N8) of the conducting path 110 substantially equals the impedance (i.e. 50 Ohm) looking into the first terminal N8 of the predetermined resistor 116, and the impedance (i.e. 50 Ohm) looking into the second end (i.e. N9) of the conducting path 112 substantially equals the impedance (i.e. 50 Ohm) looking into the second terminal N9 of the predetermined resistor 116. In other words, the impedances are matched at the connecting point (i.e. N8) between the conducting path 110 and the predetermined resistor 116. Accordingly, no reflection is generated at the first terminal N8.

According to the above description of the embodiment, the conducting path 110, the second predetermined resistor 116, and the conducting path 112 are configured to be a closed loop for the chip-select signal CSN, wherein the chip-select signal CSN is outputted at the pin N5, then passes through the conducting path 112, the second predetermined resistor 116, and the conducting path 110, and ends up at pin N4. As no reflection is generated by the chip-select signal CSN at the first second terminal N9, the waveform of the chip-select signal CSN in the specific time interval Ts1 (or Ts2) can be kept intact. Therefore, only one period of the differential clock signals CK/CKN is enough for the DDR3 memory 100a or 100b to receive the chip-select signal CSN. In other words, by using the above method, the signal integrity of the chip-select signal CSN is guaranteed, so the speed of the chip-select signal CSN can be increased.

Figure 4:
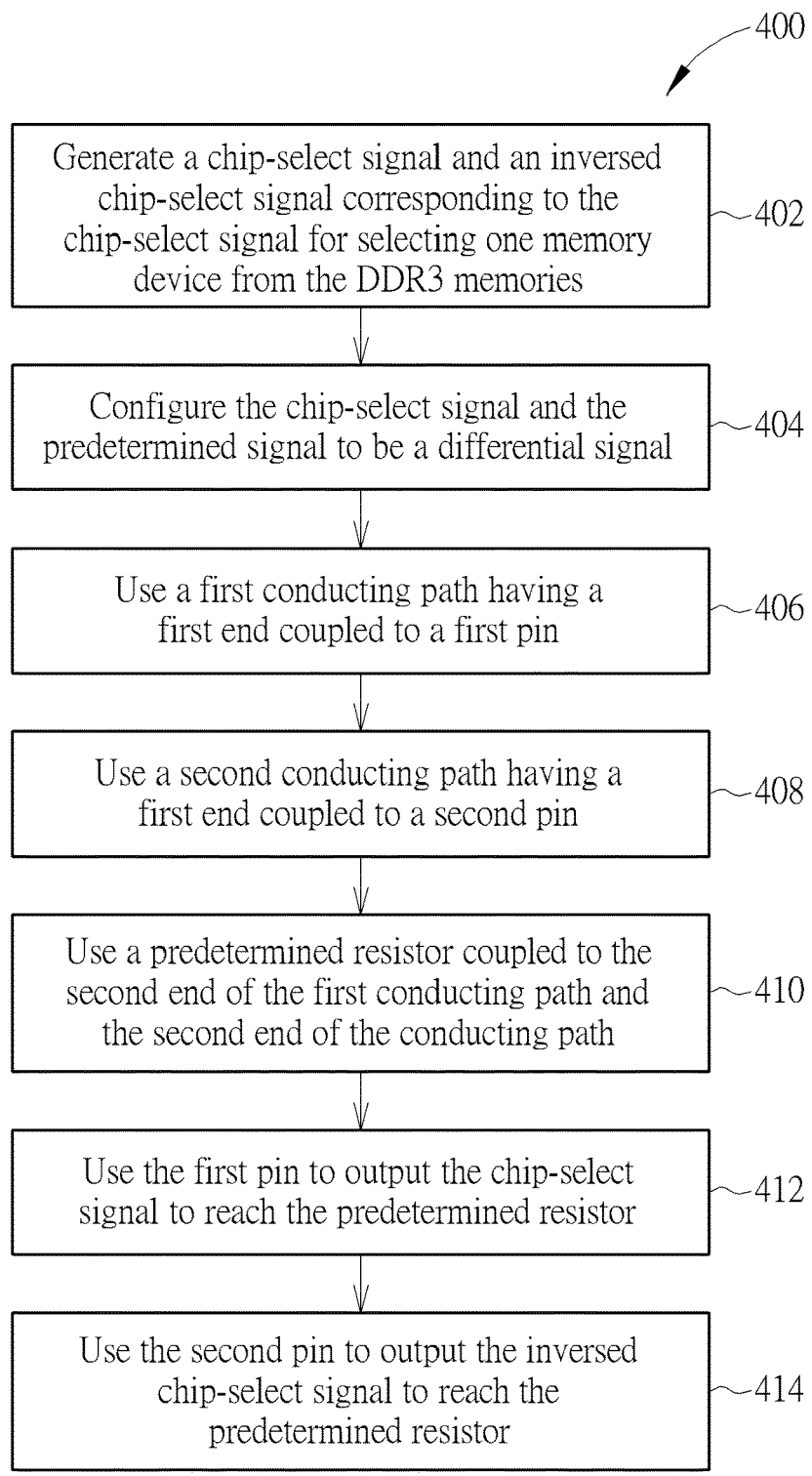
FIG. 4 is a flowchart illustrating a memory controlling method of a memory system according to an embodiment of the present invention.

In summary, the method of the above mentioned memory system 100 can be summarized into the steps of FIG. 4. FIG. 4 is a flowchart illustrating a memory controlling method 400 of the memory system 100 according to an embodiment of the present invention. Provided that substantially the same result is achieved, the steps of the flowchart shown in FIG. 4 need not be in the exact order shown and need not be contiguous, that is, other steps can be intermediate. The memory controlling method 400 comprises:

Step 402: Generate the chip-select signal CS and the chip-select signal CSN corresponding to the chip-select signal CS for selecting one memory device from the DDR3 memories 100a, 100b;

Step 404: Configure the chip-select signal CS and the inversed chip-select signal CSN to be a differential signal;

Step 406: Use the first conducting path 110 having the first end coupled to the first pin N4;

Step 408: Use the second conducting path 112 having the first end coupled to second pin N5;

Step 410: Use the predetermined resistor 116 having the first terminal N8 coupled to the second end of the first conducting path 110 and the second terminal N9 coupled to the second end of the conducting path 112;

Step 412: Use the first pin N4 to output the chip-select signal CS to reach the predetermined resistor 116;

Step 414: Use the second pin N5 to output the chip-select signal CSN to reach the DDR3 memories 100a, 100b and the predetermined resistor 116.

Briefly, the above disclosed embodiments employ a predetermined resistor to receive the chip-select signal and the complementary of the chip-select signal at the ends of the corresponding conducting paths to reduce the reflection of the chip-select signal. As the signal integrity of the chip-select signal is guaranteed, the speed of the chip-select signal can be increased. Furthermore, the BOM (Bill of Material) cost of the memory controller is also reduced in comparison to the conventional counterpart because the conventional Vtt regulator is not applied in the present embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory controller, comprising:
a chip-select transmitter, arranged to generate a plurality of signals that operate differentially to select a first memory device from a plurality of memory devices, the plurality of signals comprising a first signal and a second signal which is an inversed version of the first signal;
a first terminal, arranged to output the first signal; and
a second terminal, arranged to output the second signal;
wherein the first signal and the second signal are a pair of differential signals;
wherein the second terminal is configured to send the second signal such that the second signal bypasses the plurality of memory devices;
wherein the chip-select transmitter generates the first signal and the second signal synchronously.

2. The memory controller of claim 1, wherein when a notification is acquired to be performed by the first signal and the second signal, the first signal is asserted to a first voltage level for a specific time interval, and the second signal is asserted to a second voltage level different from the first voltage level for the specific time interval.

3. The memory controller of claim 2, wherein the memory controller further provides a clock output, and the specific time interval equals to a period of the clock output.

4. The memory controller of claim 1, wherein the memory controller is a DDR3 memory controller for controlling a DDR3 memory module.

5. A memory module, comprising:
a first terminal, arranged to receive a first signal for enabling a first memory chip of a plurality of memory chips;
a second terminal, arranged to receive a second signal for enabling the first memory chip of the plurality of memory chips;
a first conducting path, having a first end coupled to the first terminal;
the plurality of memory chips, coupled to the first conducting path for receiving the first signal;
a resistor, having a first terminal coupled to a second end of the first conducting path; and
a second conducting path, having a first end coupled to the second terminal for conducting the second signal to a second terminal of the resistor such that the second conducting path bypasses the plurality of memory chips;
wherein the first signal and the second signal are synchronous and a pair of differential signals that operate differentially to enable the first memory chip to be accessed,
wherein the second signal is an inversed version of the first signal.

6. The memory module of claim 5, wherein the first signal and the second signal reach the resistor substantially at the same time via the first conducting path and the second conducting path, respectively.

7. The memory module of claim 5, wherein a first impedance obtained by looking into the second end of the first conducting path substantially equals a second impedance obtained by looking into the first terminal of the resistor.

8. The memory module of claim 5, wherein the first signal is asserted to a first voltage level for a specific time interval, and the second signal is asserted to a second voltage level different from the first voltage level for the specific time interval.

9. The memory module of claim 8, wherein the memory controller further receives a clock input, and the specific time interval equals to a period of the clock output.

10. The memory module of claim 5, wherein the memory module is a DDR3 memory module.

11. The memory module of claim 5, wherein the resistor is a 100 Ohm resistor.

12. A memory system, comprising:
a memory controller; and
a memory module comprising a plurality of memory chips;
wherein the memory controller generates a differential pair of a first signal and a second signal, and the first signal and the second signal are synchronous with each other and operate differentially on a selected memory chip of the plurality of memory chips to enable the selected memory chip to be accessed by the memory controller;
wherein the second signal bypasses the plurality of memory chips; and
wherein the second signal is an inversed version of the first signal.

13. The memory system of claim 12, wherein when a notification is acquired to be performed by the first signal and the second signal, the first signal is asserted to a first voltage level for a specific time interval, and the second signal is asserted to a second voltage level different from the first voltage level for the specific time interval.

14. The memory system of claim 13, wherein the memory controller further provides a clock output to the memory module, and the specific time interval equals to a period of the clock output.

15. The memory system of claim 12, wherein the memory module receives the first signal and the second signal by a first terminal and a second terminal respectively; and a first impedance obtained by looking into the second terminal substantially equals a second impedance obtained by looking into the first terminal.

16. The memory system of claim 15, wherein each of the first and second impedance is equal to 50 Ohm.

17. The memory system of claim 12, wherein the memory controller is a DDR3 memory controller, and the memory module is a DDR3 memory module.

18. The memory system of claim 12, wherein the memory module comprises first and second resistors.

19. The memory module of claim 18, wherein each of the first and second resistors is a 100 Ohm resistor.

* * * * *